United States Patent [19]
Lesk et al.

[11] Patent Number: 4,928,162
[45] Date of Patent: May 22, 1990

[54] DIE CORNER DESIGN HAVING TOPOLOGICAL CONFIGURATIONS

[75] Inventors: Israel A. Lesk, Phoenix; Ronald E. Thomas, Tempe; George W. Hawkins, Mesa; James M. Rugg, Tempe, all of Ariz.

[73] Assignee: Motorola, Inc., Schaumburg, Ill.

[21] Appl. No.: 158,486

[22] Filed: Feb. 22, 1988

[51] Int. Cl.$^5$ ............................................. H01L 23/28
[52] U.S. Cl. ........................................ 357/72; 357/70; 357/52; 357/68
[58] Field of Search ............... 357/70, 72, 26, 68, 357/52

[56] References Cited
U.S. PATENT DOCUMENTS
4,625,227 11/1986 Hara et al. ............................ 357/68

FOREIGN PATENT DOCUMENTS
58-51541 3/1983 Japan ..................................... 357/52
59-163841 9/1984 Japan ..................................... 357/72
62-35545 2/1987 Japan ..................................... 357/72

Primary Examiner—Andrew J. James
Assistant Examiner—Courtney A. Bowers
Attorney, Agent, or Firm—Harry A. Wolin

[57] ABSTRACT

An improved semiconductor die for plastic encapsulated semiconductor devices which impedes the inherent delamination caused by the differing expansion coefficients of the semiconductor die and plastic encapsulation. Topological configurations are processed in the die corners of the semiconductor die which are void of circuitry. The topological configurations act as barriers and slow the delamination progression. This leaves the operational circuitry unaffected for an increased time thereby increasing device lifetime.

16 Claims, 3 Drawing Sheets

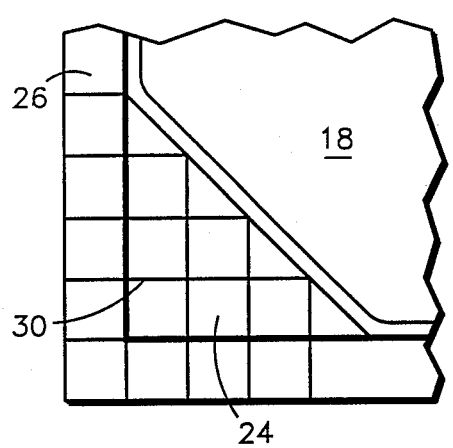
FIG. 7
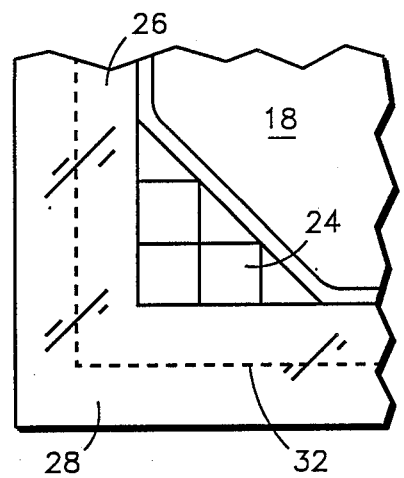
FIG. 8
FIG. 9
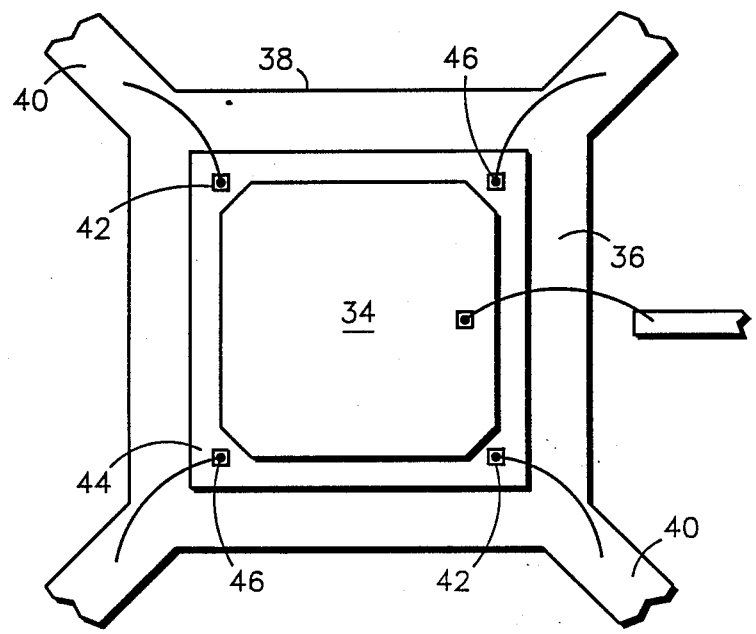

DIE CORNER DESIGN HAVING TOPOLOGICAL CONFIGURATIONS

BACKGROUND OF THE INVENTION

This invention relates, in general, to semiconductor devices, and more particularly to a semiconductor die having a corner design including topological configurations for delamination resistance.

A semiconductor device in which this invention will typically be used includes a silicon semiconductor die having metal interconnect lines which are covered by passivation glass. The die is mounted on the flag of a leadframe and the die and flag are then encapsulated in plastic at a high temperature. The expansion coefficient of the plastic encapsulant is much larger than that of the silicon die and, therefore, the plastic encapsulant cannot fully contract as it cools. In large packages, deleterious results of this thermal expansion mismatch are especially evident during temperature cycling tests where the temperature extremes often range between −65 and 150 degrees centigrade.

When the plastic encapsulant contracts, large magnitudes of stress act on the silicon semiconductor die. The stress is highest at the edges and corners of the die. The stress causes the plastic encapsulation to crack adjacent to the corner of the semiconductor die. This allows for relative motion between the plastic encapsulant and the semiconductor die which causes the passivation glass of the semiconductor die to crack and break, further causing delamination especially at the high stress corners. It is common for this delamination to travel through the metal interconnect lines and shear them into separate plates. This results in a semiconductor device having a decreased lifetime.

Prior attempts at solving the delamination problem have included voiding the die corners of the semiconductor die of circuitry, interconnects and wire bonds. Although this does not stop the delamination, it increases the lifetime of the semiconductor device because the operational circuitry is further away from the corner regions and is not affected by the initial delamination. The present invention builds upon the prior art and greatly reduces the speed of delamination thereby resulting in an increased semiconductor device lifetime.

SUMMARY OF THE INVENTION

Accordingly, it is an object of the present invention to provide a die corner design having topological configurations which will reduce stress on the operational circuitry.

Another object of this invention is to provide a die corner design having topological configurations which resist delamination.

It is an additional object of the present invention to provide a die corner design having topological configurations which allows for an increased semiconductor device lifetime.

The foregoing and other objects and advantages are achieved in the present invention by processing topological configurations in the corners of a semiconductor die. These configurations slow the delamination between the encapsulation material and the semiconductor die by providing an increased number of obstacles through which the delamination must proceed before reaching the operational circuitry of the semiconductor die.

A more complete understanding of the present invention can be attained by considering the following detailed description in conjunction with the accompanying drawings.

BRIEF DESCRIPTION OF THE DRAWINGS

FIGS. 3–8 are highly enlarged top views of circuit area corners of semiconductor dice having various topological configurations; and FIG. 9 is a highly enlarged top view of a portion of a semiconductor device having dummy wire bonds.

DETAILED DESCRIPTION OF THE DRAWINGS

Figure 1:
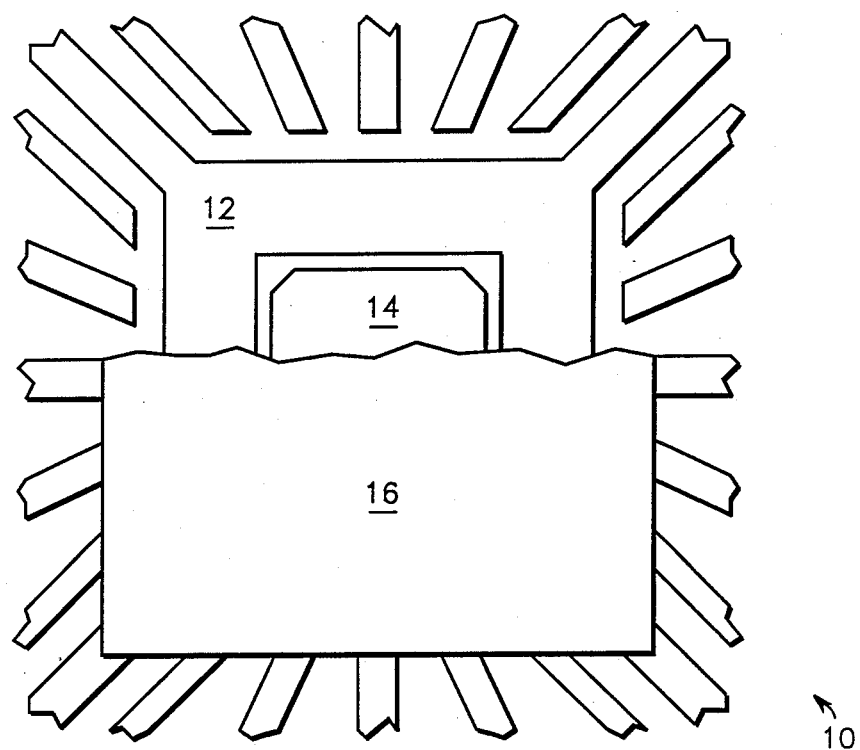
FIG. 1 is a highly enlarged top-view of a plastic encapsulated semiconductor device having a portion of the plastic encapsulation cut away.

FIG. 1 is a highly enlarged top view of a plastic encapsulated semiconductor device of the type in which the present invention will be used. The device includes a lead frame 10 having a flag 12. A semiconductor die 14 is mounted on flag 12 of lead frame 10. A portion of leadframe 10 which includes flag 12 is encapsulated in a plastic encapsulation 16 which has been partially cut away in this figure.

Figure 2:
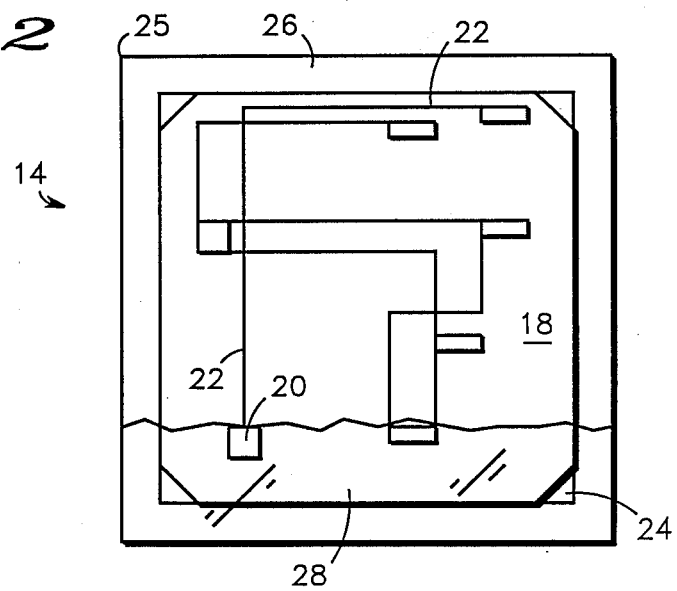
FIG. 2 is a highly enlarged top-view of the semiconductor die which is included in the device of FIG. 1.

FIG. 2 shows a highly enlarged top view of semiconductor die 14. Semiconductor die 14 includes a circuit area 18 which contains all the operational circuitry of semiconductor die 14. The operational circuitry includes a plurality of bond pads 20 and interconnect lines 22. Both bond pads 20 and interconnect lines 22 are comprised of metal. One skilled in the art will recognize that many well known metals may be employed. Semiconductor die 14 further includes circuit area corners 24 which are void of any operational circuitry and die corners 25. Circuit area corners 24 allow for a longer device lifetime by being void of operational circuitry because delamination there does not affect the operational circuitry of semiconductor die 14.

A scribe area 26 borders circuit area 18 and circuit area corners 24. Scribe area 26 is void of circuitry and serves merely as an area where semiconductor die 14 may be separated from other semiconductor dice following processing. Circuit area 18 is further covered by a passivation glass 28 which is partially removed in this figure. In this embodiment, passivation glass 28 is silicon dioxide which is doped with phosphorous. Passivation glass 28 keeps moisture and impurities away from circuit area 18 with the exception of bond pads 20 which remain uncovered. This reduces corrosion and increases device lifetime.

A frequent problem in semiconductor devices of this type is that plastic encapsulation 16 delaminates from semiconductor die 14. Further, it is common that interconnect lines 22 residing in certain peripheral regions of circuit 18 are destroyed as a result of this delamination. The delamination results because the expansion coefficients of plastic encapsulation 16 and semiconductor die 14, which is commonly made of silicon, differ. Therefore, when plastic encapsulation 16 contracts during cooling, it cracks adjacent to die corners 25 of semiconductor die 14. This crack allows for relative motion between plastic encapsulation 16 and semiconductor die 14 which, in turn, causes the delamination to occur.

FIGS. 3–8 are highly enlarged top views of circuit area corners 24 of semiconductor die 14. These figures show various topological configurations 30A–D. Forming topological configurations 30 in the areas of semiconductor die 14 which are void of circuitry will slow the delamination process. Topological configurations 30 act as barriers to the delamination.

Topological configurations 30 of FIGS. 3–8 are comprised of metal and are covered by a protective coating such as passivation glass 28. It should be understood that the metal used in topological configurations 30 is the same as that used for interconnect lines 22 and may be disposed on semiconductor die 14 using the same processing steps. Further, the metal may be covered with passivation glass 28 using the same processing steps that are used to cover interconnect lines 22.

Figure 3:
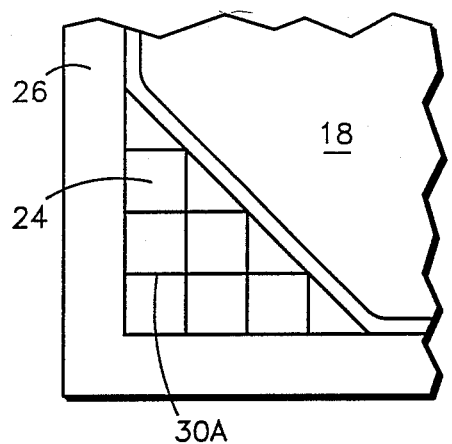
Figure 4:
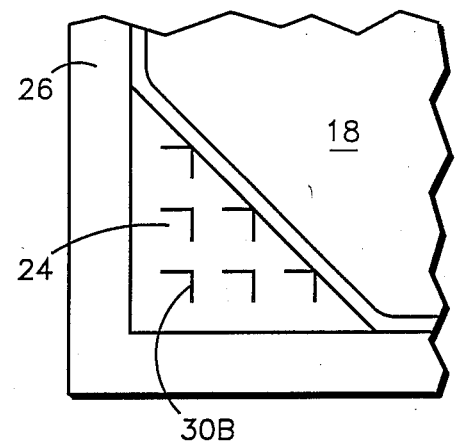
Figure 5:
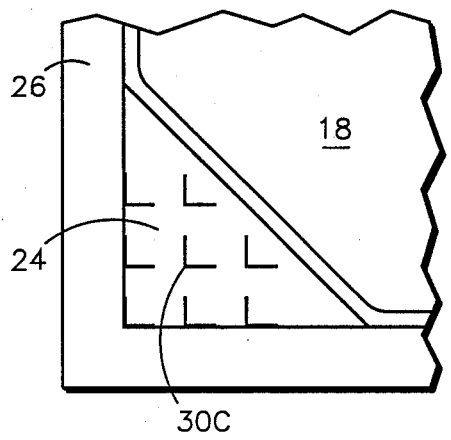
Figure 6:
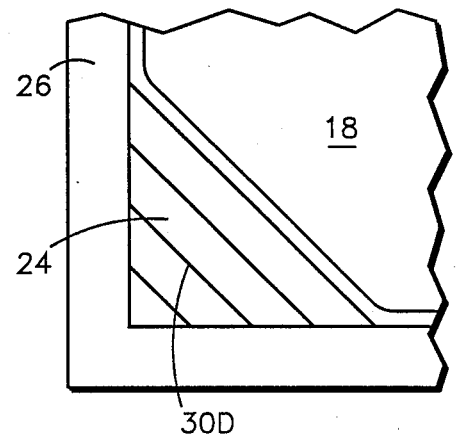

FIG. 3 shows topological configurations 30A in a honeycomb configuration. FIG. 4 shows topological configurations 30B in an inner chevron configuration. FIG. 5 shows topological configurations 30C in an outer chevron configuration while FIG. 6 shows topological configurations 30D in a dike configuration. It should be understood that any number of topological configurations 30 may be employed.

FIG. 7 shows topological configurations 30 extending beyond circuit area corners 24 and into scribe area 26. It should further be understood that topological configurations 30 may extend throughout scribe area 26 and completely border circuit area 18 of semiconductor die 14. By extending topological configurations 30 into scribe area 26, an increased number of barriers are employed which the delamination must overcome before it is able to reach circuit area 18 of semiconductor die 14. The increased barriers will prolong the useful life of the semiconductor device.

FIG. 8 shows an embodiment of the present invention wherein passivation glass 28 is slotted to an underlying metal line in scribe area 26. Slots 32 essentially separate areas of passivation glass 28 and cause an additional impediment to the delamination progression. Rather than the delamination being able to continue in a one step process, slots 32 in passivation glass 28 require the delamination to begin totally anew once reaching slots 32. It should be understood that many rows and configurations of slots 32 may be employed in passivation glass 28.

FIG. 9 discloses a highly enlarged top view of a portion of a semiconductor device having dummy wire bonds. In this embodiment, a semiconductor die 34 is mounted on a flag 36 of a lead frame 38. Leadframe 38 includes a plurality of corner leads 40 which support flag 36. A plurality of dummy bond pads 42 have been processed in the circuit area corners 44 of semiconductor die 34. Again, circuit area corners 44 are void of circuitry. Dummy wire bonds 46 are bonded to dummy bond pads 42. Dummy wire bonds 46 employ wirebonding identical to that used for wirebonding to the active pads. It should be understood that the best results will be obtained by using ball bonds or other large dummy wire bonds 46 so that a larger barrier must be overcome by the delamination. The mass of the ball bond will serve to further impede motion of the plastic inward from the corner, thus increasing the number of temperature cycles necessary to produce enough mass motion to cause a failure. It should further be understood that more than one dummy bond pad 42 may be employed in each circuit area corner 44.

Thus it is apparent that there has been provided, in accordance with the invention, an improved semiconductor device and die which meets the objects and advantages set forth above. While specific embodiments of the present invention have been shown and described, further modifications and improvements will occur to those skilled in the art. It is desired that it be understood, therefore, that this invention is not limited to the particular form shown and it is intended in the appended claims to cover all modifications which do not depart from the spirit and scope of this invention.

What is claimed is:

1. A semiconductor die having a plurality of circuit area corners which are void of circuitry, said circuit area corners having topological configurations thereon wherein said topological configurations include at least one dummy bond pad in each circuit area corner and a wire bond bonded to each dummy bond pad.

2. The semiconductor die of claim 1 wherein at least some of the topological configurations comprise a metal which is covered by passivation glass.

3. The semiconductor die of claim 2 further comprising metal interconnect lines which are covered by passivation glass.

4. The semiconductor die of claim 3 wherein at least some of the metal and passivation glass are processesd on the circuit area corners using the same processing steps that are used for processing the metal interconnect lines and passivation glass of said die.

5. The semiconductor die of claim 4 wherein said die further includes a scribe area which is void of circuitry and has topological configurations thereon.

6. The semiconductor die of claim 5 wherein the scribe area comprises topological configurations adjacent to the circuit area corners of the semiconductor die only.

7. The semiconductor die of claim 6 wherein the passivation glass on the scribe area of the die is slotted.

8. The semiconductor die of claim 1 wherein the wire bond is a ball bond.

9. A plastic encapsulated semiconductor device comprising:
   a leadframe including a flag;
   a semiconductor die disposed on said flag of said leadframe, said semiconductor die having a plurality of circuit area corners which are void of circuitry;
   at least one topological configuration in each of said circuit area corners of said semiconductor die, said at least one topological configuration including at least one dummy bond pad in each circuit area corner and a wire bond bonded to each dummy bond pad.

10. The device of claim 9 wherein at least some of the topological configurations comprise a metal which is covered by passivation glass.

11. The device of claim 10 wherein the semiconductor die further comprises metal interconnect lines which are covered by passivation glass.

12. The device of claim 11 wherein at least some of the metal and passivation glass are processed on the die corners using the same processing steps that are used for processing the metal interconnect lines and passivation glass of the semiconductor die.

13. The device of claim 12 wherein the semiconductor die includes a scribe area which is void of circuitry and has topological configurations thereon.

14. The device of claim 13 wherein the scribe area comprises topological configurations adjacent to the circuit area corners of the semiconductor die only.

15. The device of claim 14 wherein the passivation glass on the scribe area of the die is slotted.

16. The device of claim 9 wherein the wire bond is a ball bond.

* * * * *